United States Patent [19]

Lepselter et al.

[11] 4,253,029
[45] Feb. 24, 1981

[54] MASK STRUCTURE FOR X-RAY LITHOGRAPHY

[75] Inventors: Martin P. Lepselter, Summit; Hyman J. Levinstein, Berkeley Heights; Dan Maydan, Short Hills, all of N.J.

[73] Assignee: Bell Telephone Laboratories, Incorporated, Murray Hill, N.J.

[21] Appl. No.: 41,730

[22] Filed: May 23, 1979

[51] Int. Cl.³ .......................... B01J 17/00; G02B 5/00; G21F 5/04
[52] U.S. Cl. ................ 250/505; 250/492 A; 29/579
[58] Field of Search ............ 250/492 A, 505, 514; 29/579

[56] References Cited

U.S. PATENT DOCUMENTS

| | | |
|---|---|---|
| 3,743,842 | 7/1973 | Smith et al. .............. 250/492 A |
| 3,873,824 | 3/1975 | Bean et al. ................. 250/505 |
| 3,892,973 | 7/1975 | Coquin et al. .............. 250/505 |
| 4,037,111 | 7/1977 | Coquin et al. .............. 250/505 |
| 4,152,601 | 5/1979 | Kadota et al. .............. 250/505 |
| 4,170,512 | 10/1979 | Flonders et al. ........... 250/492 A |
| 4,171,489 | 10/1979 | Adams et al. .............. 250/510 |

*Primary Examiner*—Alfred E. Smith
*Assistant Examiner*—T. N. Grigsby
*Attorney, Agent, or Firm*—Lucian C. Canepa

[57] ABSTRACT

A mask substrate for use in an x-ray lithographic system comprises a boron nitride member (32, FIG. 2) coated with a polyimide layer (20) whose thickness is approximately the same as that of the boron nitride member. The substrate is mechanically strong and both optically and x-ray transparent. Mask patterns formed on the substrate are characterized by low distortion and a low defect density.

12 Claims, 2 Drawing Figures

MASK STRUCTURE FOR X-RAY LITHOGRAPHY

BACKGROUND OF THE INVENTION

This invention relates to the fabrication of very-high-resolution devices and, more particularly, to mask structures for use in an x-ray lithographic system.

One of the keys to the realization of a commercially feasible x-ray lithographic system is the construction of a suitable master mask which comprises a substrate having a pattern of x-ray-absorptive elements formed thereon. Various materials have been suggested for making the substrate of such a mask. One such material is beryllium, which is characterized by low x-ray absorption but which is expensive, optically opaque (which makes alignment and registration difficult) and toxic. In addition, silicon structures having thin x-ray-transparent windows have been fabricated, but such structures are relatively fragile and optically transparent only to a partial extent.

The use of a thick membrane of Kapton polyimide film (about 25 micrometers thick) as a relatively rugged x-ray mask substrate is described in U.S. Pat. No. 4,037,111, issued to G. A. Coquin, J. R. Maldonado and D. Maydan. (Kapton is a registered trademark of E. I. duPont de Nemours and Co.). In some applications, however, it has been found that thermally induced dimensional changes in such a Kapton film cause unacceptable distortions to occur in the pattern formed on the film.

In a commonly assigned copending application of A. C. Adams, C. D. Capio, H. J. Levinstein, A. K. Sinha and D. N. K. Wang, Ser. No. 941,776, filed Sept. 13, 1978, other mask structures for x-ray lithography are described. The masks described therein comprise a substrate made, for example, of boron nitride bonded to a support frame. Such a mask structure exhibits an advantageous substantially distortion-free characteristic. But in practice a boron nitride substrate is exceedingly fragile, difficult to handle and prone to breakage. Moreover, in some applications of importance, the surface quality of such a substrate is as a practical matter insufficiently high to serve as a basis for forming very-low-defect-density patterns thereon.

Accordingly, continuing efforts have been directed at trying to devise a mask structure which would exhibit all or most of the aforementioned desirable characteristics without any of the disadvantages of masks as heretofore constructed. It was recognized that such a mask, if available, would remove one of the major practical obstacles to realizing a rugged production-type x-ray lithographic system suitable for fabricating very-high-resolution devices.

SUMMARY OF THE INVENTION

Hence, an object of the present invention is an improved x-ray lithographic system. More specifically, an object of this invention is to provide an improved mask structure especially adapted for use in x-ray lithography.

Briefly, these and other objects of the present invention are realized in a specific illustrative embodiment thereof that includes a mask substrate comprising a boron nitride member bonded to a support frame. (In one particular embodiment this member actually comprises three layers of boron nitride.) In turn, this member is coated with an organic layer made, for example, of a polyimide material whose thickness is approximately the same as that of the boron nitride member. The resulting substrate, which constitutes a composite structure in tension, is mechanically strong and x-ray transparent. Mask patterns formed on the substrate are characterized by low distortion and a low defect density.

BRIEF DESCRIPTION OF THE DRAWING

A complete understanding of the present invention and of the above and other features thereof may be gained from a consideration of the following detailed description presented hereinbelow in connection with the accompanying drawing in which.

DETAILED DESCRIPTION

Figure 1:
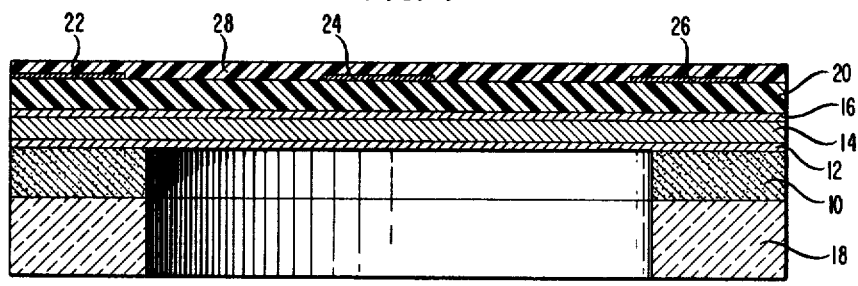
FIG. 1 is a cross-sectional representation of a specific illustrative mask structure made in accordance with the principles of the present invention.

The specific illustrative structure shown in FIG. 1 includes a member made of a material such as boron nitride as one of the main components thereof. As described in the aforecited Adams et al application, boron nitride is an attractive dimensionally stable x-ray-transparent material for fabricating x-ray masks. A boron nitride member for such a mask may include, for example, a single boron-rich boron nitride layer in tension, a single silicon-doped boron nitride layer in tension or a structure comprising a relatively thick silicon-doped boron nitride layer in tension sandwiched between two relatively thin boron nitride layers each in compression. In the sandwich structure, the compressive layers prevent the nucleation of microflaws in the relatively thick boron nitride layer.

The aforespecified sandwich structure exhibits various advantageous properties including optical transparency. Accordingly, for purposes of a specific illustrative example herein, the mask to be described in particular detail below will include as a main component thereof a boron nitride member of the sandwich type. It should be realized, however, that the principles of the present invention also extend to a mask structure having a single-layer boron nitride member. Hence, in the claims, the term "member" will be employed to encompass both single-layer and sandwich-type components made of boron nitride or similar materials.

In one specific illustrative embodiment made in accordance with the principles of the present invention, a three-layer boron nitride member is deposited on one of the planar surfaces of a substrate wafer. By way of a particular example, the substrate comprises a silicon wafer. The planar surface to be coated is polished and cleaned by standard techniques. Later in the fabrication sequence, as will be described in detail below, all but a peripheral portion of the coated silicon wafer is selectively removed thereby leaving only a supporting silicon ring to which the boron nitride member is adhered.

Such a supporting silicon ring 10 is shown in FIG. 1. Bonded to the ring 10 is a boron nitride member comprising boron nitride layers 12, 14 and 16. Advantageously, the ring 10 is adhered by, for example, conventional epoxy bonding to a strong, durable and dimensionally stable supporting member 18 that is also, illustratively, ring-shaped. It has been found that a particularly attractive material out of which to make the member 18 is a borosilicate glass having a relatively low linear coefficient of expansion over a wide temperature range. One such material is Pyrex glass which has a thermal expansion coefficient approximately equal to that of silicon. In addition, Pyrex glass is relatively inexpensive and easy to form in a variety of shapes. (Pyrex is a registered trademark of Corning Glass Works.)

In accordance with the principles of the present invention, a layer 20 having a thickness approximately equal to the overall thickness of the three boron nitride layers 12, 14 and 16 is applied to the top surface of the layer 16. Illustratively, the layer 20 comprises a polyimide coating. One advantageous material suitable for forming the layer 20 is a product designated PIQ which is a polyimide available from Hitachi Chemical Company, 437 Madison Avenue, New York, New York.

Other x-ray-transparent materials are available and suitable for forming the layer 20 by techniques such as, for example, spinning and vacuum or plasma deposition. Such materials must be characterized by good adhesion to the underlying boron nitride member and be capable of being deposited in a controlled manner to exhibit a highly planar defect-free top surface and in-plane stresses within a specified range. Moreover, the material selected for the layer 20 must maintain these properties during repeated handling and use in an x-ray lithographic system. Materials that exhibit such characteristics include a variety of standard commercially available resists such as, for example, polymethyl methacrylate and AZ positive photoresist, a variety of other standard polyimides, and highly aromatic materials that include epoxy groups.

The layer 20 of FIG. 1 imparts mechanical strength to the depicted boron nitride member and, in addition, covers defects which may exist in or on the top surface of the boron nitride member. To insure that all or substantially all of the defects on the top surface of the boron nitride member will be covered by the layer 20, it is advantageous in practice to polish this top surface before applying the layer 20 thereto.

Subsequently, as will be described in detail below, an x-ray-absorptive mask pattern comprising elements 22, 24 and 26 is defined on the top surface of the layer 20 shown in FIG. 1. Finally, an x-ray-transparent layer 28 made, for example, of a standard photoresist is deposited on the depicted mask structure to protect the elements 22, 24 and 26 from damage during handling and actual use in an x-ray lithographic system.

Figure 2:
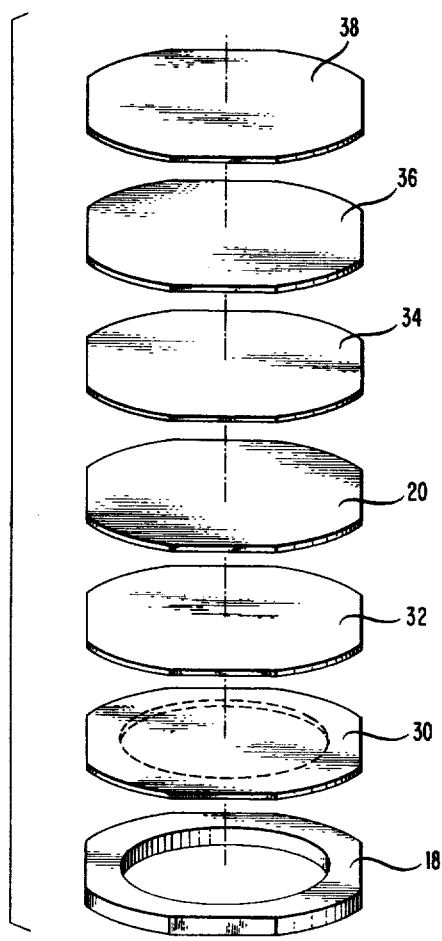
FIG. 2 is an exploded view of the constituent parts included in a mask structure of the type shown in FIG. 1.

With the aid of the exploded view shown in FIG. 2, as well as by reference to the assembled mask structure represented in FIG. 1 and already briefly described, a particular illustrative procedure for fabricating such a mask will be set forth. During the course of the description below, it will be apparent to one skilled in the art that various alternative fabrication procedures and materials are available and suitable for making a mask structure of the type devised by applicants.

A silicon wafer of the type previously specified is shown in FIG. 2 and designated by reference numeral 30. Illustratively, the wafer 30 is approximately 4.125 inches in diameter and about 0.023 inches thick. The dashed lines associated with the wafer 30 are intended to indicate that in a subsequent processing step all but a peripheral ring portion thereof is removed. At that point, the remaining portion of the wafer 30 will correspond to the supporting ring 10 shown in FIG. 1. By way of example, the ring 10 includes a hole approximately 3.0 inches in diameter.

In FIG. 2, a boron nitride member to be deposited on the top planar surface only of the wafer 30 is designated by reference numeral 32. As specified earlier above, the member 32 may actually comprise either one of three layers of, for example, boron nitride.

Boron nitride can be deposited on the top surfaces of the wafer 30 by employing any one of a number of standard techniques including, for example, high-pressure chemical vapor deposition (CVD), low-pressure CVD or sputtering. By way of a particular example, a processing sequence will be specified for depositing a three-layer boron nitride member on the wafer 30. Illustratively, a high-pressure CVD process for depositing such a three-layer member will be set forth.

The first layer 12 (FIG. 1) of the boron nitride member is deposited on the top surface of the aforespecified silicon wafer in a CVD reactor at approximately atmospheric pressure at a temperature in the range 600-to-700 degrees C. Illustratively, the layer 12 is deposited to a thickness in the range 500-to-2000 Angstrom units. The layer 12 is grown by reacting diborane ($B_2H_6$) and ammonia ($NH_3$) in an inert carrier gas such as nitrogen. Advantageously, $NH_3$-to-$B_2H_6$ gas ratios by weight in the range 1-to-2 are established in the reactor. The flow of the $NH_3$ gas therein approximates 150-to-300 cubic centimeters per minute, and the flow of the $B_2H_6$ gas is set at about 10-to-60 cubic centimeters per minute. In one specific embodiment, a 1000-Angstrom-unit-thick layer 12 was deposited on the wafter 30 at 625 degrees C. in approximately 7 minutes. Illustratively, layers of this type are fabricated to exhibit an in-plane compressive stress in the range $0.5$-to-$1.5 \times 10^9$ dynes per square centimeter.

Next, in the same high-pressure CVD reactor, a tensile silicon-doped boron nitride layer 14 is deposited on top of the layer 12. Silicon doping is achieved by introducing a controlled amount of silane ($SiH_4$) into the reactor. For the composite mask depicted in FIG. 1, optimum tension in the overall structure is obtained in practice with approximately 7 atomic percent silicon in the layer 14. But percentages in the range 1-to-7 are also feasible. Satisfactory results are achieved by establishing $NH_3$-to-$B_2H_6$ gas ratios in the range 4-to-20, $SiH_4$-to-$B_2H_6$ gas ratios in the range 0.05-to-0.1, a $B_2H_6$ flow of 10-to-60 cubic centimeters per minute, and an $NH_3$ flow of 150-to-300 cubic centimeters per minute. A layer 14 1-to-12 micrometers thick is suitable for inclusion in the mask structure of FIG. 1. In one specific embodiment, a 6-micron-thick layer 14 of 7 atomic percent silicon-doped boron nitride was deposited on top of the layer 12 at 625 degrees C. in approximately 166 minutes. Illustratively, layers of this type are fabricated to exhibit an in-plane tensile stress in the range $0.3$-to-$0.5 \times 10^9$ dynes per square centimeter.

Subsequently, a compressive boron nitride layer 16 (FIG. 1) similar to and made in the same way as the aforedescribed layer 12 is deposited on top of the layer 14. At that point in the fabrication sequence, it is advantageous to bond the wafer 30 (FIG. 2) coated with the aforedescribed boron nitride member to the Pyrex ring 18 shown in FIG. 1 and FIG. 2. A number of adhesives including standard epoxies are suitable for this purpose.

Next, as mentioned earlier above, it is advantageous to polish the top surface of the boron nitride member. Hillocks and other imperfections that extend above the top planar surface of the member are thereby removed or at least reduced in height. Various conventional polishing techniques may be employed to abrade any such imperfections including, for example, utilizing a syton polishing agent on soft felt laps.

A layer 20 (represented in both FIG. 1 and FIG. 2) is then applied to the top surface of the boron nitride member. In accordance with the principles of the present invention, the thickness of the layer 20 is approximately the same as that of the boron nitride member. In one specific embodiment in which the thickness of the boron nitride member was about 6 micrometers, the thickness of the layer 20 was controlled to be about 5.5 micrometers.

For the illustrative case in which the layer 20 comprises a polyimide such as the aforespecified PIQ material, it is advantageous to apply the material to the boron nitride member by spinning. Thus, for example, such a polyimide is applied while the surface to be coated is rotated at about 800 revolutions per minute. Moreover, to assist in achieving a uniform thickness of the layer 20, it is advantageous to dry the polyimide during the spinning operation. Drying under an infrared lamp for about 5 minutes achieves satisfactory results. In practice, such a spinning and heating procedure avoids the build-up of polyimide material around the rim of the layer 20. Subsequently, the layer 20 is cured in a vacuum oven at approximately 225 degrees C. for about 8 hours. In one particular illustrative mask structure, a polyimide layer 20 prepared in this specific manner exhibited an inplane tensile stress of about $7 \times 10^9$ dynes per square centimeter.

In one specific illustrative embodiment of the principles of the present invention, a composite mask substrate comprising a three-layer boron nitride member and a polyimide layer 20 of the type specified above retained its stiffness and dimensional stability over a wide temperature range extending, for example, from about 20-to-300 degrees C.

An x-ray-absorptive layer or layers to be patterned are then applied to the surface of the cured layer 20. (In FIG. 1, elements 22, 24 and 26 are generic representations of x-ray-absorptive elements patterned from a member composed of one or more layers.) Illustratively, a tri-level metallization member is sputter deposited in a standard way on the layer 20. In one specific embodiment, such a member comprises the following three metals deposited in order on the layer 20: a 300-Angstrom-unit-thick layer 34 (FIG. 2) of tantalum, a 6000-Angstrom-unit-thick layer 36 of gold, and a 1000-Angstrom-unit-thick layer 38 of tantalum.

To protect the top of the metallized mask structure during subsequent fabrication steps, a temporary protective layer (not shown in the drawing) is then advantageously applied on top of the aforedescribed metallization member. Illustratively, the protective layer comprises an organic material such as a 2000-Angstrom-unit-thick layer of a standard photoresist.

Next, the entire central portion of the silicon wafer 30 (FIG. 2) is removed. This is done in an etching apparatus in which only the bottom surface of this central portion is exposed to an etchant. Illustratively, an etching solution comprising a 3:5:3 mixture by volume of hydrofluoric, nitric and acetic acids, respectively, is sprayed onto the bottom surface of the wafer 30 to remove the central portion thereof in its entirety.

During the etching process, some fumes from the acid solution unavoidably leak around seals included in the etching apparatus and attack the front or top surface of the mask structure. But, due to the presence of the aforespecified protective layer on the structure, the metallization member thereof is not affected.

The etched mask structure is then washed, rinsed and dried to remove all traces of acid as well as any particles formed during the etching process. The temporary protective layer is then removed by spraying the top of the mask with conventional organic solvents.

Next, the aforedescribed metallization member is patterned in a standard way. Illustrative techniques for patterning the member are specified, for example, in U.S. Pat. No. 3,900,737 issued to R. J. Collier and D. R. Herriott (which describes an electron beam system for exposing and developing an overlying resist layer to form a high-resolution pattern therein) and in U.S. Pat. No. 4,037,111 issued to G. A. Coquin, J. R. Maldonado, D. Maydan and S. R. Somekh (which describes techniques for replicating the resist pattern in the underlying metallization member).

The x-ray-absorptive pattern so formed is represented in FIG. 1 by the elements 22, 24 and 26. In practice, it is advantageous to coat these elements with a layer 28 to protect the pattern from damage during subsequent handling and use in an x-ray lithographic system. Such a protective coating comprises, for example, a 2000-Angstrom-unit-thick layer of a standard photoresist.

An x-ray mask substrate of the specific illustrative type described herein is highly transparent to x-rays whose wavelength is below 45 Angstrom units and, importantly, is also optically transparent. From actual measurements, it has been determined that such a substrate permits the replication of patterns thereon with average pattern distortions less than 0.2 micrometers over a 3-inch-diameter area. Significantly, the surface quality of such a composite substrate is particularly well suited to the fabrication of masks characterized by low defect densities. Illustratively, masks comprising such substrates have in actual practice been measured to have defect densities of less than 2 per square centimeter.

Finally, it is to be understood that the various above-described arrangements and procedures are only illustrative of the application of the principles of the present invention. In accordance with these principles, numerous alternatives may be devised by those skilled in the art without departing from the spirit and scope of the invention. For example, although emphasis herein has been directed to a composite mask structure including a boron nitride member as a main component thereof, it is to be understood that in some cases of practical importance other materials such as boron carbide or silicon carbide may be substituted therefor. Moreover, in a three-layer member of the type depicted in FIG. 1 in which, however, the middle layer 14 comprises boron nitride that is not silicon-doped, each of the other layers 12 and 16 of the member may be made of a material other than boron nitride, and the entire member may be grown in a low-pressure CVD reactor. Thus, for example, the layers 12 and 16 may alternatively be made of boron carbide or silicon carbide or silicon nitride or silicon dioxide. Illustratively, such alternative three-layer members may be deposited in a low-pressure CVD apparatus at a pressure of 0.3-to-0.5 torr at a temperature in the range 250-to-600 degrees C.

Additionally, although in practice the in-plane stress of a silicon-doped boron nitride member of the particular type described in detail herein-above is advantageously controlled to be tensile in nature, it has been determined that even a slightly compressive silicon-doped boron nitride member coated with a tensile organic layer is not wrinkled or otherwise distorted after etching away the interior portion of the supporting member thereof.

Lastly, it is emphasized that in specific illustrative embodiments of the principles of the present invention, the thickness of the layer 20 (FIG. 1) is typically approximately the same as that of the underlying member which is, for example, made of boron nitride. Such a specific composite lamination has been determined empirically to exhibit the herein-specified desired properties of an x-ray mask substrate to a particularly advantageous extent in actual practical applications.

We claim:

1. A mask structure for x-ray lithography comprising a support member, an x-ray-transparent member bonded to said support member, said x-ray-transparent member being made of a material selected from the group consisting of boron nitride, boron carbide and silicon carbide, and an x-ray-transparent organic layer deposited on said x-ray-transparent member to form therewith a tensile composite substrate for supporting an x-ray-absorptive pattern in a low-distortion low-defect-density way, said x-ray-transparent member and layer each having approximately the same thickness.

2. A mask structure as in claim 1 wherein said layer is made of a polyimide material exhibiting an inplane tensile stress.

3. A mask structure as in claim 2 wherein said x-ray-transparent member comprises a boron nitride layer which has been silicon-doped to provide a layer in tension.

4. A mask structure as in claim 3 wherein said x-ray-transparent member comprises said silicon-doped boron nitride layer in tension interposed between two relatively thin undoped boron nitride layers each in compression.

5. A mask structure as in claim 4 wherein said support member comprises a silicon ring.

6. A mask structure as in claim 5 wherein said support member further comprises a Pyrex ring bonded to said silicon ring.

7. A mask structure as in claim 6 wherein an x-ray-absorptive pattern comprising three-layer elements each made of a layer of gold sandwiched between layers of tantalum is formed on and adhered to the top surface of said layer of polyimide material.

8. A mask structure as in claim 7 further including an x-ray-transparent protective layer deposited on the top surfaces of said elements and said layer of polyimide material.

9. A mask structure as in claim 8 wherein the thickness of said boron nitride member is approximately 6 micrometers, the thickness of said polyimide material is approximately 5.5 micrometers, each of said x-ray-absorptive elements is approximately 0.73 micrometers thick, and the thickness of said protective layer is approximately one micrometer.

10. In combination in a mask structure, a boron nitride member bonded to a support frame, and an optically- and x-ray-transparent layer of an organic material bonded to said member, said layer of organic material having approximately the same thickness as said member and forming therewith a composite structure in tension.

11. An x-ray-transparent mask structure comprising a lamination of a boron nitride member and a polyimide layer, said member and layer each having approximately the same thickness and the top surface of said layer being characterized by an in-plane tensile stress, and wherein said member is peripherally bonded to a support element.

12. An x-ray lithographic process for fabricating high-resolution devices by illuminating in its entirety a patterned mask structure that comprises a lamination of a boron nitride member and an approximately equal-thickness polyimide layer to selectively irradiate an associated wafer coated with an x-ray-sensitive material.

* * * * *